United States Patent
Lewis et al.

(10) Patent No.: US 8,217,678 B1
(45) Date of Patent: *Jul. 10, 2012

(54) FRACTURABLE LOOKUP TABLE AND LOGIC ELEMENT

(75) Inventors: David Lewis, Toronto (CA); Bruce Pedersen, Sunnyvale, CA (US); Sinan Kaptanoglu, Belmont, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/834,404

(22) Filed: Jul. 12, 2010

Related U.S. Application Data

(63) Continuation of application No. 11/841,727, filed on Aug. 20, 2007, now Pat. No. 7,800,401, which is a continuation of application No. 11/753,048, filed on May 24, 2007, now Pat. No. 7,312,632, which is a continuation of application No. 11/189,549, filed on Jul. 25, 2005, now Pat. No. 7,323,902, which is a continuation of application No. 10/364,310, filed on Feb. 10, 2003, now Pat. No. 6,943,580.

(51) Int. Cl.
   *H03K 19/173* (2006.01)

(52) U.S. Cl. .......................... 326/38; 326/41

(58) Field of Classification Search ............. 326/37–41, 326/46
   See application file for complete search history.

(56) References Cited

U.S. PATENT DOCUMENTS

| | | |
|---|---|---|
| 5,260,610 A | 11/1993 | Pendersen et al. |
| 5,260,611 A | 11/1993 | Cliff et al. |
| 5,274,581 A | 12/1993 | Cliff et al. |
| 5,295,090 A | 3/1994 | Hsieh et al. |
| 5,349,250 A | 9/1994 | New |
| 5,359,242 A | 10/1994 | Veenstra |
| 5,359,468 A | 10/1994 | Rhodes et al. |
| 5,365,125 A | 11/1994 | Goetting et al. |
| 5,436,575 A | 7/1995 | Pedersen et al. |

(Continued)

FOREIGN PATENT DOCUMENTS

| | | |
|---|---|---|
| JP | 2003-018000 | 7/1997 |

(Continued)

OTHER PUBLICATIONS

Lewis, D., et al., "Fracturable Lookup Table and Logic Element," filed Feb. 10, 2003, U.S. Appl. No. 10/364,310.

(Continued)

*Primary Examiner* — Don Le

(74) *Attorney, Agent, or Firm* — Weaver Austin Villeneuve & Sampson LLP

(57) ABSTRACT

A logic element includes memory elements, multiplexers, and controls. The multiplexers are arranged in levels including a highest level of multiplexers with inputs connected to the memory elements and outputs connected to inputs of a next-to-highest level of multiplexers and a first level of multiplexers with inputs connected to outputs of a second level of multiplexers and at least one output. The controls are connected to the multiplexers. In a first operational mode the controls determine a first-mode output at the at least one output of the first level of multiplexers, and in a second operational mode the controls determine a plurality of second-mode outputs at selected outputs of multiplexers not at the first level of multiplexers.

20 Claims, 8 Drawing Sheets

U.S. PATENT DOCUMENTS

| | | | |
|---|---|---|---|
| 5,481,206 | A | 1/1996 | New et al. |
| 5,481,486 | A | 1/1996 | Cliff et al. |
| 5,483,478 | A | 1/1996 | Chiang |
| 5,485,103 | A | 1/1996 | Pedersen et al. |
| 5,488,316 | A | 1/1996 | Freeman et al. |
| 5,500,608 | A | 3/1996 | Goetting et al. |
| 5,523,963 | A | 6/1996 | Hsieh et al. |
| 5,546,018 | A | 8/1996 | New et al. |
| 5,586,044 | A * | 12/1996 | Agrawal et al. .......... 326/38 |
| 5,629,886 | A | 5/1997 | New |
| 5,631,576 | A | 5/1997 | Lee et al. |
| 5,672,985 | A | 9/1997 | Lee |
| 5,675,262 | A | 10/1997 | Duong et al. |
| 5,724,276 | A | 3/1998 | Rose et al. |
| 5,761,099 | A | 6/1998 | Pedersen |
| 5,818,255 | A | 10/1998 | New et al. |
| 5,889,411 | A | 3/1999 | Chaudhary |
| 5,898,319 | A | 4/1999 | New |
| 5,898,602 | A | 4/1999 | Rothman et al. |
| 5,905,385 | A | 5/1999 | Sharpe-Geisler |
| 5,909,126 | A | 6/1999 | Cliff et al. |
| 5,920,202 | A | 7/1999 | Young et al. |
| 5,926,036 | A | 7/1999 | Cliff et al. |
| 5,999,016 | A | 12/1999 | McClintock et al. |
| 6,021,423 | A | 2/2000 | Nag et al. |
| 6,051,992 | A | 4/2000 | Young et al. |
| 6,107,827 | A | 8/2000 | Young et al. |
| 6,118,300 | A | 9/2000 | Wittig et al. |
| 6,154,052 | A | 11/2000 | New |
| 6,154,053 | A | 11/2000 | New |
| 6,154,055 | A | 11/2000 | Cliff et al. |
| 6,157,209 | A | 12/2000 | McGettigan |
| 6,191,610 | B1 | 2/2001 | Wittig et al. |
| 6,191,611 | B1 | 2/2001 | Altaf |
| 6,288,568 | B1 | 9/2001 | Bauer et al. |
| 6,288,570 | B1 | 9/2001 | New |
| 6,297,665 | B1 | 10/2001 | Bauer et al. |
| 6,323,682 | B1 | 11/2001 | Bauer et al. |
| 6,359,469 | B1 | 3/2002 | Mendel et al. |
| 6,388,466 | B1 | 5/2002 | Wittig |
| 6,400,180 | B2 | 6/2002 | Wittig et al. |
| 6,501,296 | B2 | 12/2002 | Wittig et al. |
| 6,943,580 | B2 | 9/2005 | Lewis et al. |
| 7,312,632 | B2 | 12/2007 | Lewis et al. |
| 7,323,902 | B2 | 1/2008 | Lewis et al. |
| 2001/0030555 | A1 | 10/2001 | Wittig et al. |
| 2002/0057103 | A1 | 5/2002 | Ngai et al. |

FOREIGN PATENT DOCUMENTS

| | | |
|---|---|---|
| JP | H05-025025 | 1/2005 |
| JP | H09-181598 | 8/2009 |
| WO | 98/43354 | 10/1998 |

OTHER PUBLICATIONS

Office Action mailed Jun. 4, 2004 for U.S. Appl. No. 10/364,310.
Final Office Action mailed Dec. 14, 2004 for U.S. Appl. No. 10/364,310.
Notice of Allowance mailed Apr. 12, 2005 for U.S. Appl. No. 10/364,310.
Lewis, D., et al., "Fracturable Lookup Table and Logic Element," filed Jul. 25, 2005, U.S. Appl. No. 11/189,549.
Notice of Allowance mailed Feb. 12, 2007 for U.S. Appl. No. 11/189,549.
Lewis, D., et al., "Fracturable Lookup Table and Logic Element," filed May 24, 2007, U.S. Appl. No. 11/753,048.
Notice of Allowance mailed Aug. 13, 2007 for U.S. Appl. No. 11/753,048.
Lewis, D., et al., "Fracturable Lookup Table and Logic Element," filed Aug. 20, 2007, U.S. Appl. No. 11/841,727.
Office Action Mailed Mar. 20, 2009, for U.S. Appl. No. 11/841,727.
Final Office Action Mailed Oct. 14, 2009, for U.S. Appl. No. 11/841,727.
European Office Action mailed Nov. 16, 2007 for Application No. 04250564.4
Notice of Allowance mailed Feb. 19, 2010 for U.S. Appl. No. 11/753,048.
Notice of Allowance mailed Apr. 16, 2010 for U.S. Appl. No. 11/753,048.
Allowed Claims for U.S. Appl. No. 11/753,048.
Chinese First Office Action mailed Oct. 13, 2006 for Application No. 200410033018.8
Chinese Second Office Action mailed Jul. 24, 2009 for Application No. 200410033018.8
Japanese Office Action mailed Aug. 4, 2009 for Application No. 2004-033729.
European Office Search Report dated Oct. 28, 2005, Application No. 04250564.4.
E. Ahmed, et al., "The Effect of LUT and Cluster Size on Deep-Submicron FPGA Performance and Density", FPGA 2000 Monterey CA, pp. 3-12.
D. Cherepacha et al., "DP-FPGA: An FPGA Architecture Optimized for Datapaths", VLSI Design 1996, vol. 4, No. 4, pp. 329-343.
S. Kaptanoglu et al., "A New High Density and Very Low Cost Reprogrammable FPGA Architecture", FPGA 99, Monterey CA, pp. 3-12, 1999.
J. Rose et al., "Architecture of Field-Programmable Gate Arrays: The Effect of Logic Block Functionality on Area Efficiency", Journal of Solid-State Circuits, vol. 25, No. 5, Oct. 1990, pp. 1217-1224.
J. L. Kouloheris et al., "FPGA Area Versus Cell Granularity-Lookup Tables and PLA Cells", FPGA 92, pp. 9-14, 1992.
"FLEX 8000 Programmable Logic Device Family", Altera Corp. Jun. 1999, Ver. 10.01, pp. 349-364.
"FLEX 10K Embedded Programmable Logic Device Family", Altera Corp. Mar. 2001, Ver. 4.1, pp. 1-28.
"FLEX 6000 Programmable Logic Device Family", Altera Corp, Mar. 2001, Ver. 4.1, pp. 1-17.
"Mercury Programmable Logic Device Family", Altera Corp., Mar. 2002, Ver. 2.0, pp. 1-34.
APEX 20K Programmable Logic Device Family, Altera Corp., Feb. 2002, Ver. 4.3, pp. 1-29.
"Virtex™-II Platform FPGAS: Detailed Description", XILINX, Advance Product Specification, v2.1.1, Dec. 6, 2002, 40 pages.
"Stratix FPGA Family Data Sheet", Altera Corp., Preliminary Information, Dec. 2002, Ver. 3.0, pp. 1, 11-19.
ORCA® Series 2 Field-Programmable Gate Arrays, Data Sheet, Lattice Semiconductor Corp., Jan. 2003, 26 pages.
Chinese Office Action dated Mar. 24, 2011, from Application No. 201010142831.4.

* cited by examiner

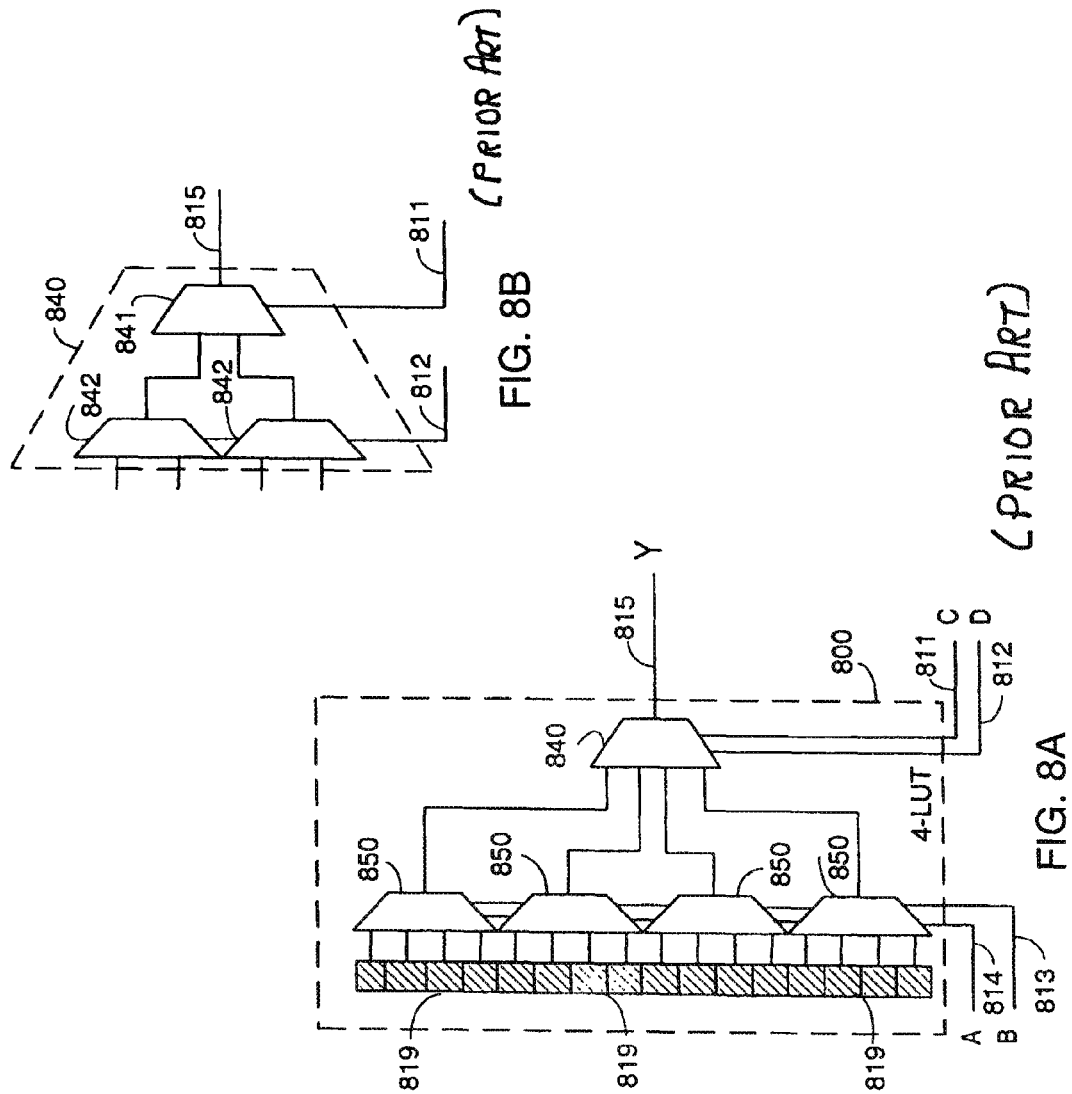

FRACTURABLE LOOKUP TABLE AND LOGIC ELEMENT

CROSS-REFERENCE TO RELATED APPLICATIONS

This application is a continuation of and claims priority from U.S. patent application Ser. No. 11/841,727, filed Aug. 20, 2007, titled "FRACTURABLE LOOKUP TABLE AND LOGIC ELEMENT", which is a continuation of U.S. patent application Ser. No. 11/753,048, now U.S. Pat. No. 7,312,632, filed May 24, 2007, titled "FRACTURABLE LOOKUP TABLE AND LOGIC ELEMENT", which is continuation of U.S. patent application Ser. No. 11/189,549, now U.S. Pat. No. 7,323,902, filed Jul. 25, 2005, titled "FRACTURABLE LOOKUP TABLE AND LOGIC ELEMENT", which is a continuation of U.S. application Ser. No. 10/364,310, now U.S. Pat. No. 6,943,580, filed Feb. 10, 2003, titled "FRACTURABLE LOOKUP TABLE AND LOGIC ELEMENT", all of which are incorporated herein by this reference for all purposes.

BACKGROUND OF THE INVENTION

The present invention relates to logic elements for use with programmable logic devices or other similar devices.

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, which are sometimes referred to as logic array blocks ("LABs") or "configurable logic blocks" ("CLBs"). Logic elements ("LEs"), which are also referred to by other names such as "logic circuits" or "logic cells", may include a look-up table ("LUT"), product term, carry-out chain, register, and other elements.

Logic elements, including LUT-based logic elements, typically include configurable elements holding configuration data that determine the particular function or functions carried out by the logic element. A typical LUT circuit may include RAM bits that hold data (a "1" or "0"). However, other types of configurable elements may be used. Some examples may include static, magnetic, ferro-electric or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by a PLD.

As discussed above, PLDs are commonly constructed using a lookup table (LUT) as the basic logic element. For example, a K-input lookup table (K-LUT) typically includes $2^K$ programmable memory elements, and a $2^K$ to 1 multiplexer, selecting one of the storage elements under the control of the K select inputs to the multiplexer. These K inputs can be considered to be the inputs to a K-input logic function which can implement any particular required logic function by setting the contents of the memory elements to the appropriate values.

There is a tradeoff between cost and speed of a logic circuit constructed with LUTs. Typically the cost of each LUT grows exponentially with the choice of K, but the number of LUTs required to build a logic circuit decreases more slowly with larger values of K. However, the number of LUTs that are in series for a larger value of K will be reduced, making the logic circuit faster. For example, with K=4, sixteen memory elements and a 16:1 multiplexer are required to build a single LUT, and for K=6, sixty-four memory elements and a 64:1 multiplexer are required. A given logic circuit might require one-thousand 4-LUTs, but only eight-hundred 6-LUTs. Under these assumptions, more hardware is required to construct the 6-LUT logic elements because the reduced number of LUTs is insufficient to compensate for the larger complexity of each LUT. However, the increased hardware requirements for the 6-LUT circuitry are offset by a reduction in the delay. The longest path through a logic circuit might be ten 4-LUTs versus eight 6-LUTs. Thus the 6-LUT version of the circuit might be larger, but faster. Further, the 6-LUT circuit would likely require less programmable routing in a PLD, offsetting some of its higher cost.

One reason for the lack of efficiency of larger LUTs is that not all logic functions will use all K inputs. For the example described above, the eight-hundred 6-LUTs might actually include three-hundred 6-input functions, three-hundred 5-input functions, one-hundred 4-input functions, and one-hundred 3-input functions. Thus, the LE based on 6-LUTs is only being used to its fullest extent in three-hundred out of eight-hundred instances.

Thus, there is a need for a logic element with programmable structures that can be configured to implement a relatively large LUT or alternatively a multiplicity of smaller LUTs.

SUMMARY OF THE INVENTION

In one embodiment of the present invention, a logic element includes memory elements, multiplexers, and controls. The multiplexers are arranged in levels including a highest level of multiplexers with inputs connected to the memory elements and outputs connected to inputs of a next-to-highest level of multiplexers and a first level of multiplexers with inputs connected to outputs of a second level of multiplexers and at least one output. The controls are connected to the multiplexers. In a first operational mode the controls determine a first-mode output at the at least one output of the first level of multiplexers, and in a second operational mode the controls determine second-mode outputs at selected outputs of multiplexers not at the first level of multiplexers. According to one aspect of this embodiment, when the logic element is in the first operational mode, the first-mode output provides a complete function of the controls. According to another aspect, when the logic element is in the second operational mode, each second-mode output provides a complete function of a proper subset of the controls. According to another aspect, when the logic element is in the second operational mode, one or more controls are split into sub-controls so that a corresponding sub-control replaces each split control at each multiplexer connected to that split control. According to another aspect, the logic element further includes one or more control multiplexers with outputs connected to one or more of the controls of the logic element and with inputs determined by control-multiplexer inputs. Under some operational conditions, at least two of the control multiplexers receive an identical control-multiplexer input. According to another aspect, the logic element further includes additional multiplexers that can be combined with flip-flops. According, to another aspect, the logic element further includes one of more mode multiplexers connected to the logic element for switching between the first operational mode and the second operational mode. According to another aspect, the logic element is included in a programmable logic device, which itself may be included in a data processing system.

In another embodiment of the present invention, a method of making a logic element includes providing memory elements, providing multiplexers, and providing controls. The multiplexers are arranged in levels including a highest level of multiplexers with inputs connected to the memory elements and outputs connected to inputs of a next-to-highest level of multiplexers and a first level of multiplexers with inputs connected to outputs of a second level of multiplexers and at least one output. The controls are connected to the multiplexers. In a first operational mode the controls determine a first-mode output at the at least one output of the first level of multiplexers, and in a second operational mode the controls determine second-mode outputs at selected outputs of multiplexers not at the first level of multiplexers. This embodiment may include aspects described above with respect to other embodiments. According to another aspect the method further includes adding to the logic element one or more control multiplexers with outputs connected to one or more of the controls of the logic element and with inputs determined by control-multiplexer inputs. According to another aspect, the method further includes adding to the logic element one or more mode multiplexers connected to the logic element for switching between the first operational mode and the second operational mode.

BRIEF DESCRIPTION OF THE DRAWINGS

FIG. 8A shows a conventional 4-LUT; FIG. 8B shows further detail of the 4:1 multiplexer shown in FIG. 8A.

DETAILED DESCRIPTION OF EXEMPLARY EMBODIMENTS

Figure 7:
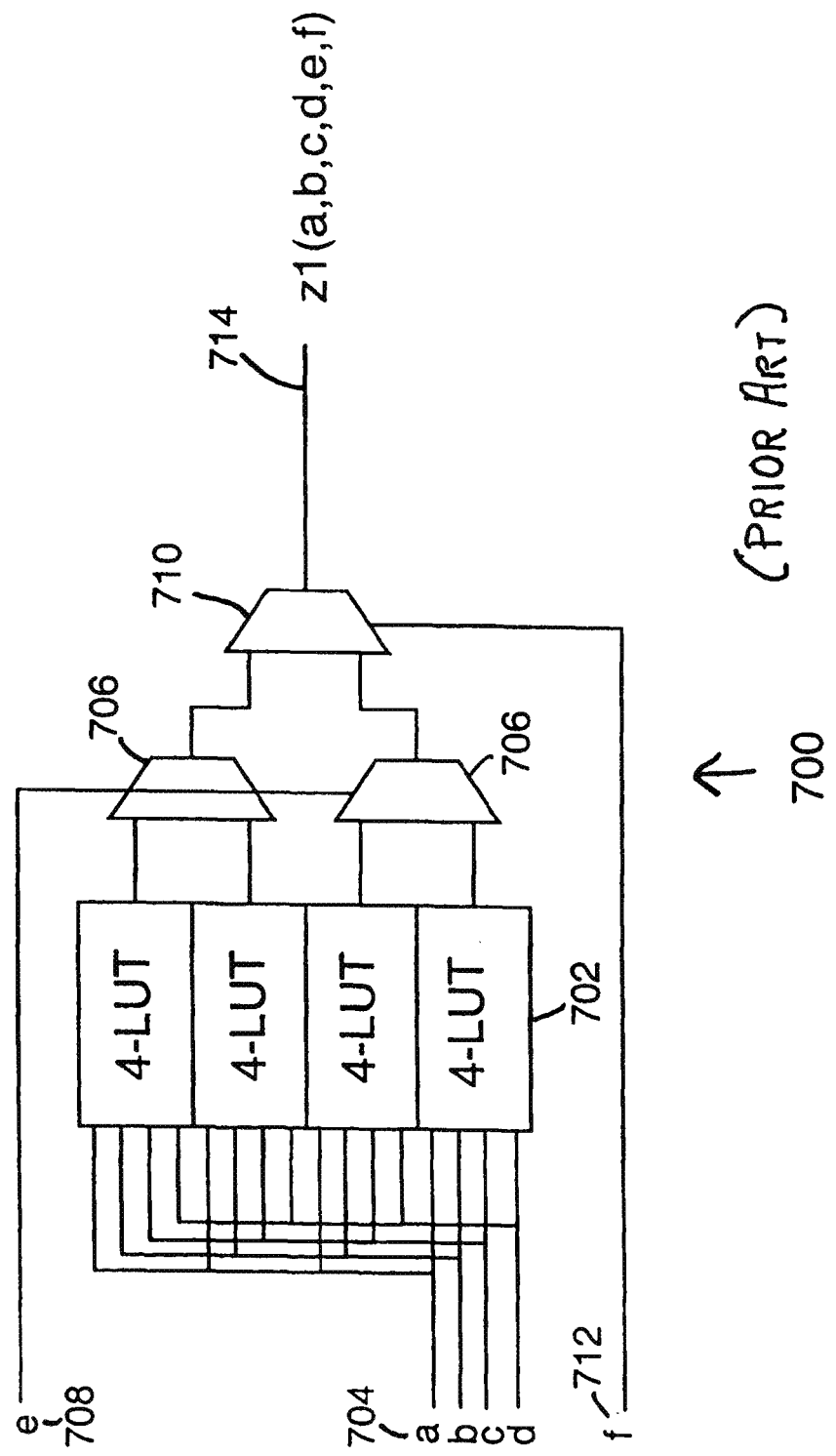
FIG. 7 shows a conventional 6-LUT.

FIG. 7 shows a conventional 6-LUT 700 that includes four 4-LUTs 702. Each 4-LUT 702 includes sixteen memory elements and a 16:1 multiplexer that is controlled by inputs a, b, c, and d 704. Outputs from the 4-LUTs 702 provide inputs to two 2:1 multiplexers 706, each of which is controlled by input e 708. Outputs from these multiplexers provide inputs to an additional 2:1 multiplexer 710 that is controlled by input f 712 to provide a final output 714. In this way any function of six inputs z1 (a,b,c,d,e,f) can be implemented.

FIG. 8A shows a conventional 4-LUT 800, which could be used as a component of the 6-LUT shown in FIG. 7. The 4-LUT 800 includes memory elements 819, and 4:1 multiplexers 850, 840. Each memory element 819 can hold one data bit (i.e., 1 or 0) and each is coupled to provide that bit to an input of a multiplexer 850 as shown. Two control inputs of each multiplexer 850 are coupled to, respectively, an input A 814 and an input B 813 of the 4-LUT 800. The output of each of these multiplexers 850 is coupled to an input of another 4:1 multiplexer 840 as shown. Two control inputs of this multiplexer 840 are coupled to, respectively, an input C 811 and an input D 812 of the 4LUT 800. The output of this multiplexer 840 provides the final output 815 of the 4-LUT 800.

Those skilled in the art will appreciate that a 4-LUT such as the 4-LUT 800 of FIG. 8A can provide a complete function of four input signals. "Complete" in this context simply means that the memory elements 819 can be programmed to configure the 4-LUT 800 to perform any four-input function. That is, the 4-LUT 800 can be configured by programming its memory elements (e.g., loading values into those elements) so that the output signal Y 815 is any one of a full range of logical functions of the input signals A 814, B 813, C 811 and D 812 as will be appreciated by those skilled in the art. Similarly, the 6-LUT of FIG. 7 also provides a complete function of its six input signals.

FIG. 8B illustrates the "tree" of 2:1 multiplexers 841, 842 that make up the final 4:1 multiplexer 840. (The other 4:1 multiplexers 850 can be similarly characterized.) Control inputs 811, 812 of the multiplexers 841, 842 correspond to inputs of the 4-LUT 800. An output at a higher level of multiplexers 842 (i.e., closer to the memory elements 819) feeds into the next level 841 closer to the output 815. As will be appreciated by those skilled in the art, one can consider the "tree" of the 2:1 multiplexers 841, 842 making up the final 4:1 multiplexer 840 as part of a larger 2:1 multiplexer tree that characterizes the 4-LUT 800. More generally, a typical LUT circuit has a multiplexer tree that may be referenced by "levels" of 2:1 multiplexers provided relative to the LUT circuit output.

For example, the multiplexer 841 closest to the output 815 may be called a first level of multiplexers in the overall 2:1 multiplexer tree of the 4-LUT 800 and the next set of two multiplexers 842 may be called a second level in that tree. By extending the structure of FIG. 8B to FIG. 8A, there are four levels of 2:1 multiplexers in the 4LUT 800. The 4-LUT 800 has a third level that includes four 2:1 multiplexers (i.e., one for each multiplexer 150) with control inputs coupled to logic input B 813, and a fourth level that includes eight 2:1 multiplexers (i.e., two for each multiplexer 150) with control inputs coupled to logic input A 114.

As will be appreciated by those skilled in the art, a 4:1 multiplexer may be implemented in a manner other than the illustrated multiplexer 840, which has a "tree" of three 2:1 multiplexers 841, 842 at two distinct levels. For example, a 4:1 multiplexer might be implemented by four pass gates with each of the pass gates being controlled by the decoded output of two control signals. In such an example, the four pass gates themselves would not be differentiated by levels relative to each other, however, the 4:1 multiplexer would effectively implement two levels of 2:1 multiplexing.

Figure 1:
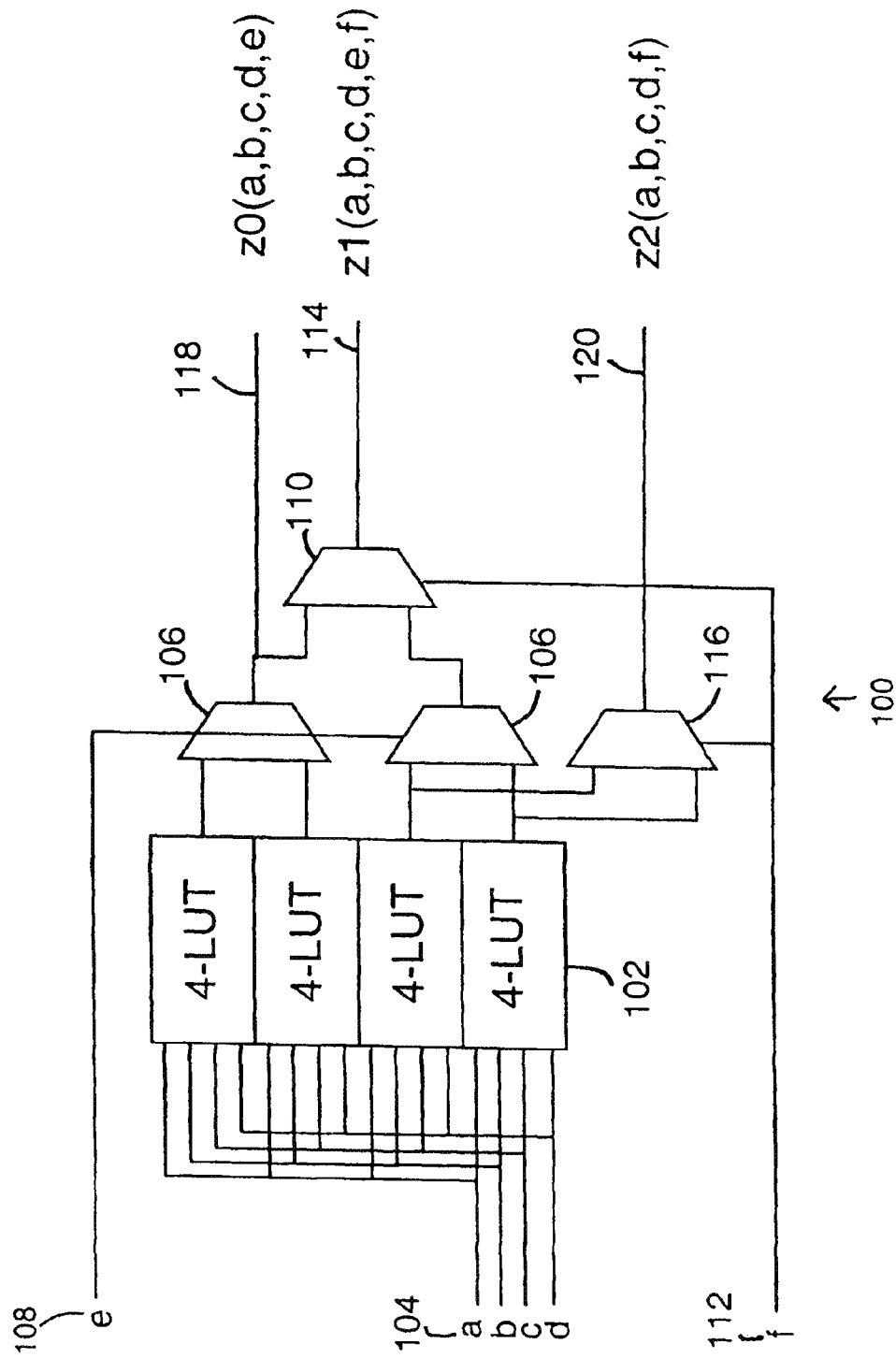
FIG. 1 shows a fracturable 6-LUT ("six-input lookup table circuit) according to an embodiment of the present invention.

FIG. 1 shows a fracturable 6-LUT 100 according to a first embodiment of the present invention. Similarly as in the conventional 6-LUT 700, the fracturable 6-LUT 100 includes four 4-LUTs 102. Each 4-LUT 102 includes sixteen memory elements and a 16:1 multiplexer that is controlled by inputs a, b, c, and d 104. Outputs from the 4-LUTs 102 provide inputs to two 2:1 multiplexers 106, each of which is controlled by input e 108. Outputs from these multiplexers 106 provide inputs to an additional 2:1 multiplexer 110 that is controlled by input f 112 to provide a final output 114. In this way any function of six inputs $z1(a,b,c,d,e,f)$ can be implemented.

As compared with the conventional 6-LUT 700, the fracturable 6-LUT 100 includes an additional 2:1 multiplexer 116 that takes inputs from two of the 4-LUTs 102 and is controlled by input f 112. When used as a 6-LUT (i.e., in a non-fractured mode of operation), the output signal z1 114 is a complete function of all 6 inputs. When used as two functions (i.e., in a fractured mode of operation), the output z0 118 which is taken from the top half of the LUT 100 provides a complete function of a,b,c,d,e and the output z.2 120, taken from the extra 2:1 multiplexer 116, provides a complete function of a,b,c,d,f. Thus the LUT can implement two 5-input functions that share the four inputs a, b, c, and d. Logic external to the fracturable LUT is used to select between the z1 function 114 when the LUT 100 is used as a single 6-LUT, or the z0 118 and z2 120 outputs when the LUT 100 is used as two 5-LUTs. It can be appreciated that it is possible to continue the fracturing of the LUT further, so that for example a fracturable 6-LUT could be configured as a combination of one 5-LUT and two 4-LUTs. (This could be done, for example, by replacing the z0 118 output by corresponding outputs from the top two 4-LUTs 102.) Other combinations are similarly possible including a combination of one 5-LUT and one or two 3-LUTs, or, most directly from the structures shown in FIG. 1, a combination of four 4-LUTs.

As illustrated in FIG. 1 for the case K=6, a fracturable K-LUT has only K inputs, so that the two (K−1) functions must use a common set of K input signals. This means that each (K−1)-LUT has only one unique input signal, and shares (K−2) signals with another LUT. In order to increase the flexibility of using the fracturable LUT it is desirable to include more input signals. This can be done by splitting some of the common signals to the early LUT stages. This is denoted as a fracturable (K,M)-LUT, where M refers to the number of extra input signals that are added to the LUT.

Figure 2:
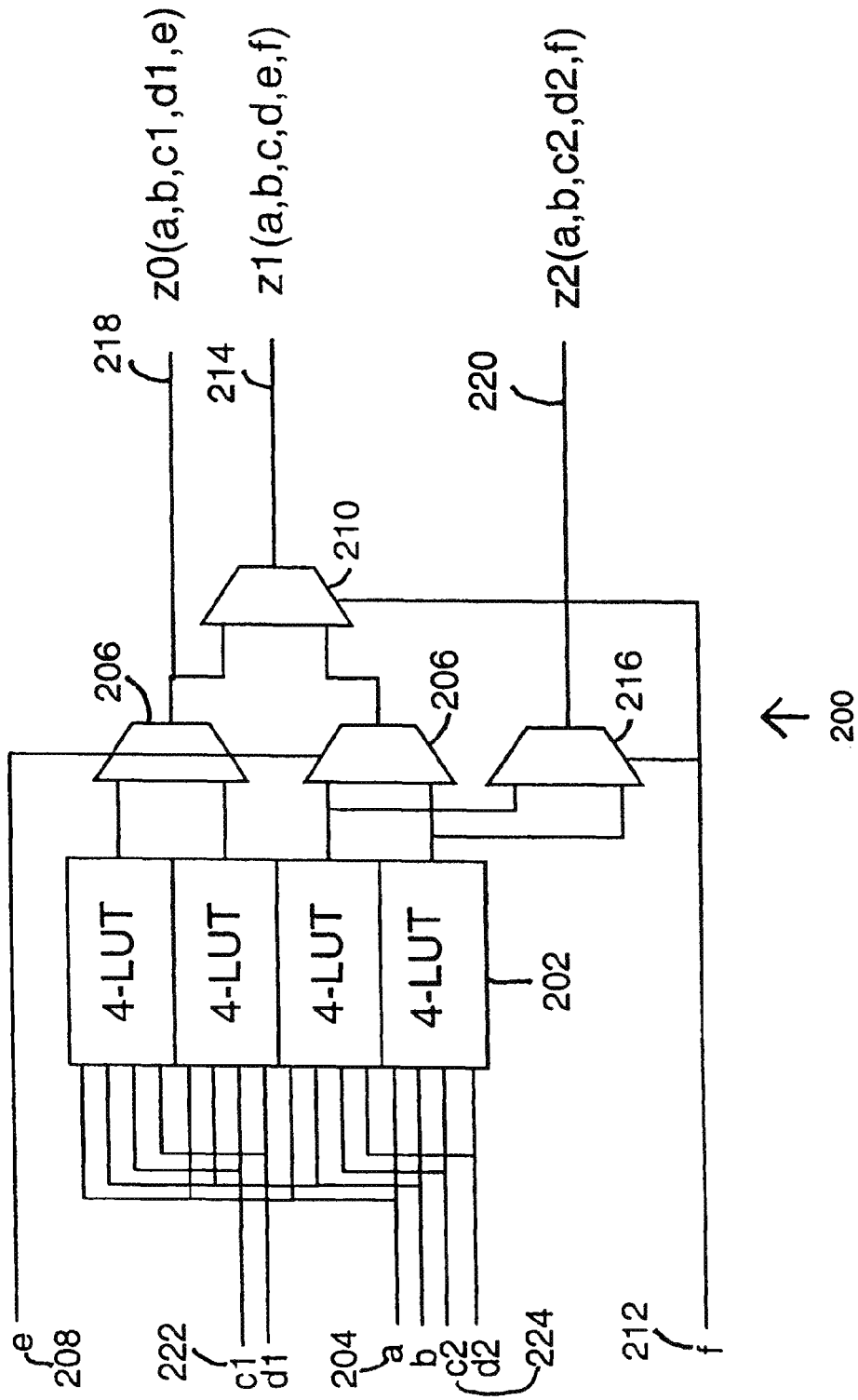
FIG. 2 shows a fracturable (6,2)-LUT according to an embodiment of the present invention.

FIG. 2 shows a fracturable (6,2)-LUT according to another embodiment of the present invention. Similarly as in fracturable 6-LUT 100 of FIG. 1, the fracturable (6,2)-LUT 200 includes four 4-LUTs 202. Each 4-LUT 202 includes sixteen memory elements and a 16:1 multiplexer. Outputs from the 4-LUTs 202 provide inputs to two 2:1 multiplexers 206, each of which is controlled by input e 208. Outputs from these multiplexers 206 provide inputs to an additional 2:1 multiplexer 210 that is controlled by input f 212 to provide a final output 214. An additional 2:1 multiplexer 216 takes inputs from two of the 4-LUTs 202 and is controlled by input f 212.

As compared with the fracturable 6-LUT 100, two of the inputs to the four 4-LUTs 202 are split. That is, two inputs a and b 204 correspond to similar inputs 104 in the fracturable 6-LUT 100. However, inputs c and d 104 from the fracturable 6-LUT 100 are split into inputs c1 and d1 222 for the upper half of the 4-LUTs 202 and inputs c2 and d2 224 for the lower half.

Conventionally, the inputs to the LUT are listed (i.e., a, b, c, d) in order from slowest to fastest, so that the d is the fastest input to each of the 4-LUTs 202. It is desirable to split the fastest inputs to the LUT so that the fastest inputs are independent from each other. When the LUT is used as a 6-LUT, d1 and d2 are provided with the same input signal (i.e., d=d1=d2) and similarly c1 and c2 are provided with the same input signal (i.e., c=c1=c2). When the LUT is used as two 5-LUTs, the top two 4-LUTs form a logic function $z0(a,b,c1,d1,e)$ and the bottom two 4-LUTs form a logic function $z2(a,b,c2,d2,f)$. Thus only two logic signals, a and b, must be shared between the two LUTs.

Thus, in a fractured mode of operation, complete functions of five inputs can be implemented for $z0(a,b,c1,d1,e)$ 218 and $z2(a,b,c2,d2,e)$ 220, and in a non-fractured mode of operation with c=c1=c2 and d=d1=d2, a complete function of six inputs $z1(a,b,c,d,e,f)$ 214 can be implemented.

Alternatively, the fracturable (6,2)-LUT 200 can implement any two functions that use no more than eight distinct input signals, such as a 3-input function and a 5-input function, by configuring the LUT to have no functional dependency on one or more of its inputs. For example, the (6,2)-LUT 200 can implement functions $z0(c1,d1,e)$ 218 and $z2(a,b,c2,d2,f)$ 220 by configuring the top half of the 4-LUTs 202 to have no dependency on inputs a and b 204. In general a (K,M)-LUT can implement any two functions of up to K−1 inputs that have no more than K+M distinct input signals.

The fracturable (6,2)-LUT 200 may also be used for incomplete logic functions by using the eight inputs a, b, c1, c2, d1, d2, e, and f 208, 222, 204, 224, 212 together with the output at z1 214. In this case, some set of 8-input functions z1 (a,b,c1,c2,d1,d2,e) can be implemented, but, unlike a general LUT, not every 8-input function can be implemented. However, this may be exploited by attempting to design logic circuits that contain these functions as well as arbitrary functions.

Another aspect of a logic element is the ability to feed a flip-flop from the LUT. Conventionally the LUT output may be used as the data input to a flip-flop contained in the same logic element. Also, under the control of various configuration information and logic signals, the data input to the flip-flop may be selected to be one of the inputs to the LUT. The present invention desirably enables combining a fracturable LUT with one or more flip-flops in a logic element.

Figure 3:
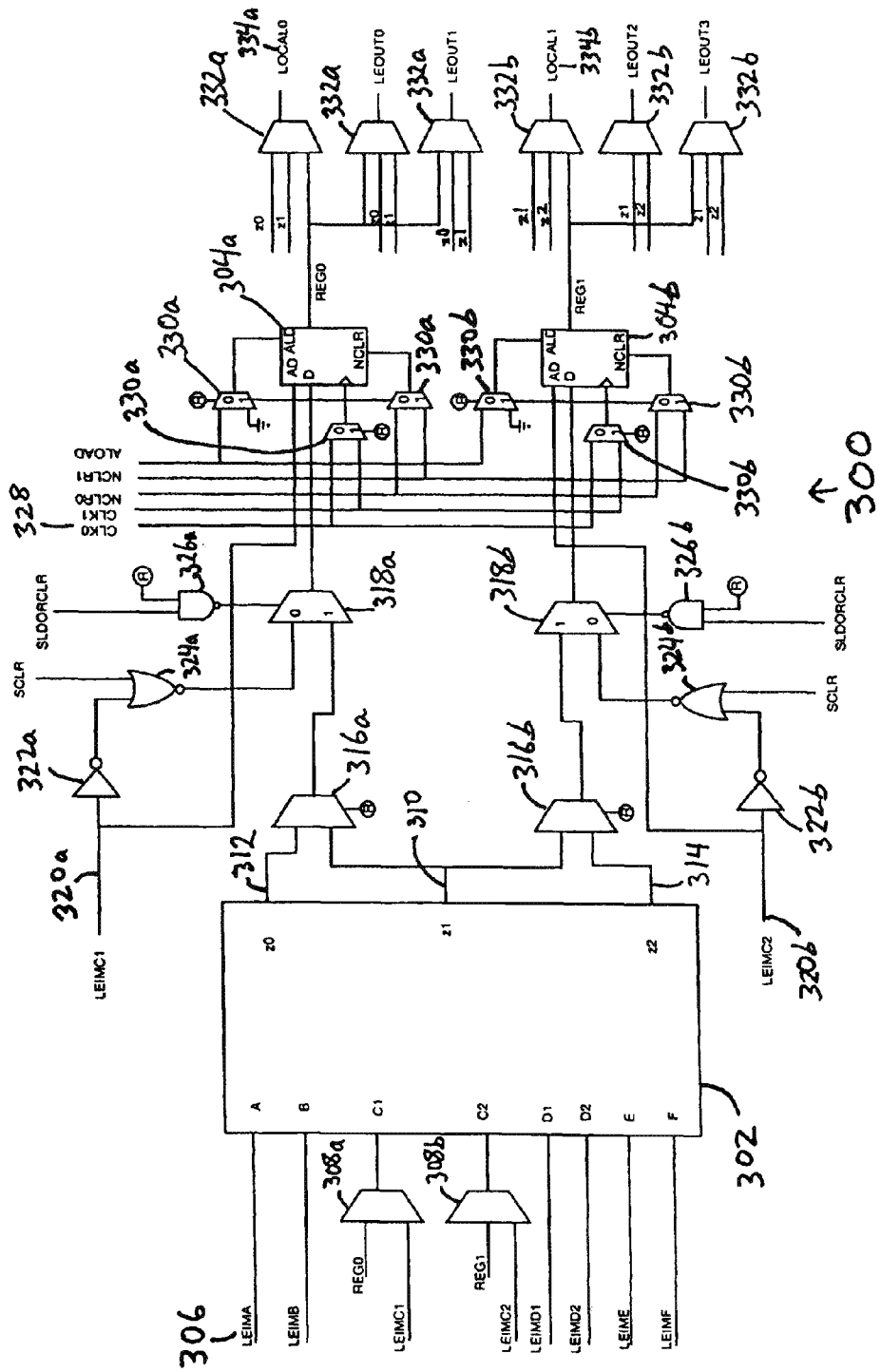
FIG. 3 shows a fracturable (6,2)-LUT with two flip-flops according to an embodiment of the present invention.

FIG. 3 shows a logic element 300 according to another embodiment of present invention. The logic element 300 includes a fracturable (6,2)-LUT 302 and two flip-flops 304a, 304b. The (6,2)-LUT 302 has inputs A, B, C1, C2, D1, D2, E, and F, where these are fed through input lines LEIMA, LEIMB, LEIMC1, LEIMC2, LEIMD1, LEIMD2, LEIME, and LEIMF 306. Additionally two multiplexers 308a, 308b feed inputs C1 and C2 by multiplexing LEIMC1 with a register value REG0 and by multiplexing LEIMC2 with a register value REG1. In a non-fractured mode, the LUT 302 provides a single output z1 310, and in a fractured mode the LUT 302 provides two outputs z0 123 and z1 314.

The outputs from the LUT 302 are inputs to two multiplexers 316a, 316b. These multiplexers 316a, 316b provide input to another pair of multiplexers 318a, 318b that also take inputs from input lines LEIMC1 320a and LEIMC2 320b combined with circuitry of inverters 322a, 322b, NOR-gates 324a, 324b, and NAND-gates 326a, 326b.

Output from these latter multiplexers 318a, 318b and line values LEIMC1 320a and LEIMC2 320b are fed to the flip-flops 304a, 304b, which also receives data from a combination of stored values 328 and multiplexers 330a, 330b. The structures associated with these flip-flops 304a, 304b are similar to those used in the Stratix logic element currently sold by Altera Corporation of San Jose, Calif.

Output from the first flip-flop 304a together with LUT outputs z0 312 and z1 310 go to a first set of three multiplexers 332a to determine a first set of outputs LOCAL0, LEOUT0, and, LEOUT0 334a. Output from the second flip-flop 304b together with LUT outputs z1 310 and z2 314 go to a second set of three multiplexers 332b to determine a second set of outputs LOCAL1, LEOUT2, and LEOUT3 334a.

This logic element 300 desirably includes multiplexing structures for driving up to four signals out of the LE (i.e., LEOUT0, LEOUT1, LEOUT2, and LEOUT3) and two signals to internal routing (i.e., LOCAL0 and LOCAL1). In this diagram the line signals LEIMx 306 refer to the sources of the logic signals connected to the inputs of the logic element. The embodiment of FIG. 3 desirably includes two flip-flops 304a, 304b. The LUT 302 can now generate two logic functions, so it is desirable to have two flip-flops that can load data from the non-fractured K-LUT, or from either of the fractured LUTs.

As discussed above, the flip-flop connectivity shown in FIG. 3 can be generalized. A variety of alternative embodiments are possible where the relevant flip-flop data input may be either the LUT output or in common with one of the LUT inputs. In the embodiment shown in FIG. 3, the arrangement of logic is similar to the Stratix logic element currently sold by Altera Corporation of San Jose, Calif.

In the embodiment of FIG. 3, each of the flip-flops 304a, 304b can load from the G-LUT output z1 310 or from one of the two 5-LUT outputs z0 312 and z2 314. Each output can select from the 6-LUT output, a 5-LUT output, or a flip-flop. Multiplexers are also provided to feed the flip-flop outputs back into the LUT to provide quick-feedback as in the Stratix device. Using this structure, the 6-LUT can feed one or both flip-flops, each 5-LUT can feed a flip-flop, or independent flip-flops may be combined with a 5-LUT that shares one input or a 4-LUT that does not share an input. However, this structure has a limitation in that it is not possible to combine a 6-LUT with an independent flip-flop unless it shares an input, even though a total of eight inputs are available. This is because in non-fractured 6-LUT mode, both C1 and C2, as well as D1 and D2, must both supply the same input signal to the LUT (i.e., C=C1=C2, D=D1=D2). The embodiment of FIG. 4 addresses this issue.

Figure 4:
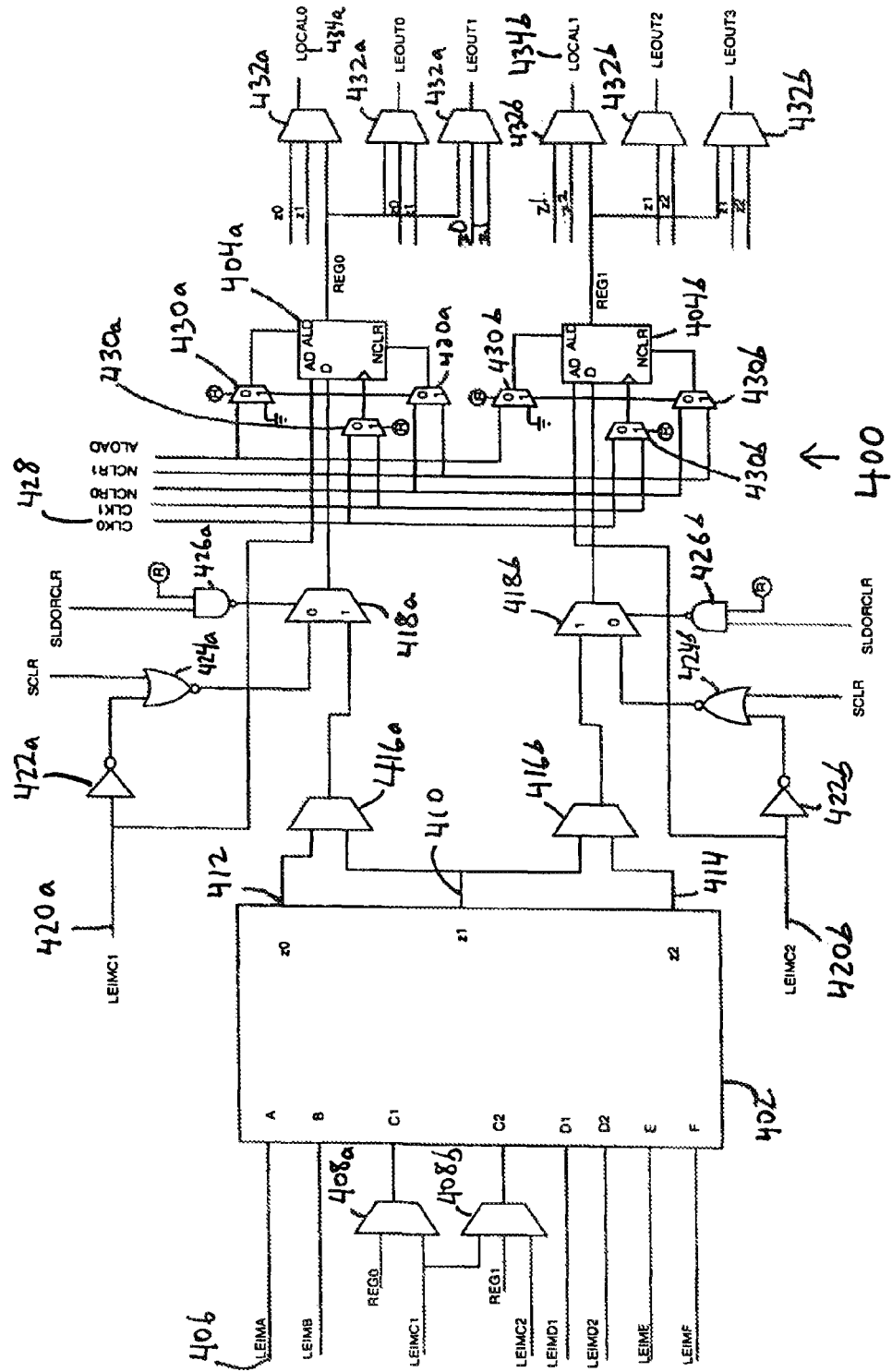
FIG. 4 shows a fracturable (6,2)-LUT with support for 6-LUT and independent register according to an embodiment of the present invention.

FIG. 4 shows a logic element 400 according to another embodiment of present invention. This logic element 400 is similar to the logic element 300 of FIG. 3 but includes additional multiplexing, at the inputs to the LUT 402. Input line LEIMC1 406 and register value REG0 are inputs to a multiplexer 408a that feeds the C1 input of the LUT 402, and input lines LEIMC1 and LEIMC2 406 together with register value REG1 are inputs to a multiplexer 408b that feeds the C2 input of the LUT 402.

The logic element 400 includes a fracturable (6,2)-LUT 402 and two flip-flops 404a, 404b. The (6,2)-LUT 402 has inputs A, B, C1, C2, D1, D2, E, and F, where these are fed through input lines LEIMA, LEIMB, LEIMC1 LEIMC2, LEIMD1, LEIMD2, LEIME, and LEIMF 406. Additionally two multiplexers 408a, 408b feed inputs C1 and C2 by multiplexing LEIMC1 with a register value REG0 and by multiplexing LEIMC2 with a register value REG1. As distinct from the embodiment of FIG. 3, the second multiplexer 408b, which feeds input C2, receives input from input line LEIMC1, input line LEIMC2 and register value REG1.

Similarly as in the previous embodiment 300, the LUT 402 provides a single output z1 410 in a non-fractured mode and two outputs, z0 412 and z1 414, in a fractured mode. Also as in the previous embodiment the circuitry includes additional lines for LEMC1 420a and LEMC2 420b, multiplexers 416a, 416b, 418a, 418b, 430a, 430b, 432a, 4326, inverters 422a, 422b, NOR-gates 424a, 424b, NAND-gates 426a, 426b, stored values 428, and outputs 434a, 434b.

The embodiment of FIG. 4 advantageously exploits the additional input signals when the LUT 402 operates in the non-fractured mode. In this structure one of the extra inputs that resulted from splitting the original inputs (in this case C1) may be connected to its corresponding split input (in this case C2) at a corresponding multiplexer 408b. This allows the 6-LUT to bring the C signal on a single pin C1 and connect it to both C1 and C2 in the LUT 402. As a consequence, input pin C2 can now be used for another purpose, in this case to bring a data signal into a completely independent flip-flop 404b. This allows the logic element to support a 6 LUT that may optionally feed a flip-flop 404a, together with an independent flip-flop 404b.

In the embodiment of FIG. 4, the 6-LUT can be used with quick feedback of the registers to the input of the LUT by using, both flip-flops to load the identical data, so the result can be fed back to both C1 and C2. In an alternative embodiment both REG0 and REG1 are input to either one or both of the multiplexers 408a, 408b feeding C1 and C1. This allows a single flip-flop to be used to store the data, and be fed back to both C1 and C2. The various alternatives differ in the choice of which flip-flops 404a, 404b can be used for quick feedback mode in the 6-LUT 402, and the optimal choice will depend on the logic circuits to be implemented and the flexibility of the routing structures provided in the PLD. Although it is generally preferable to feed the flip-flop with the slowest of the split inputs to the LUT, other inputs may be used as well.

Figure 5:
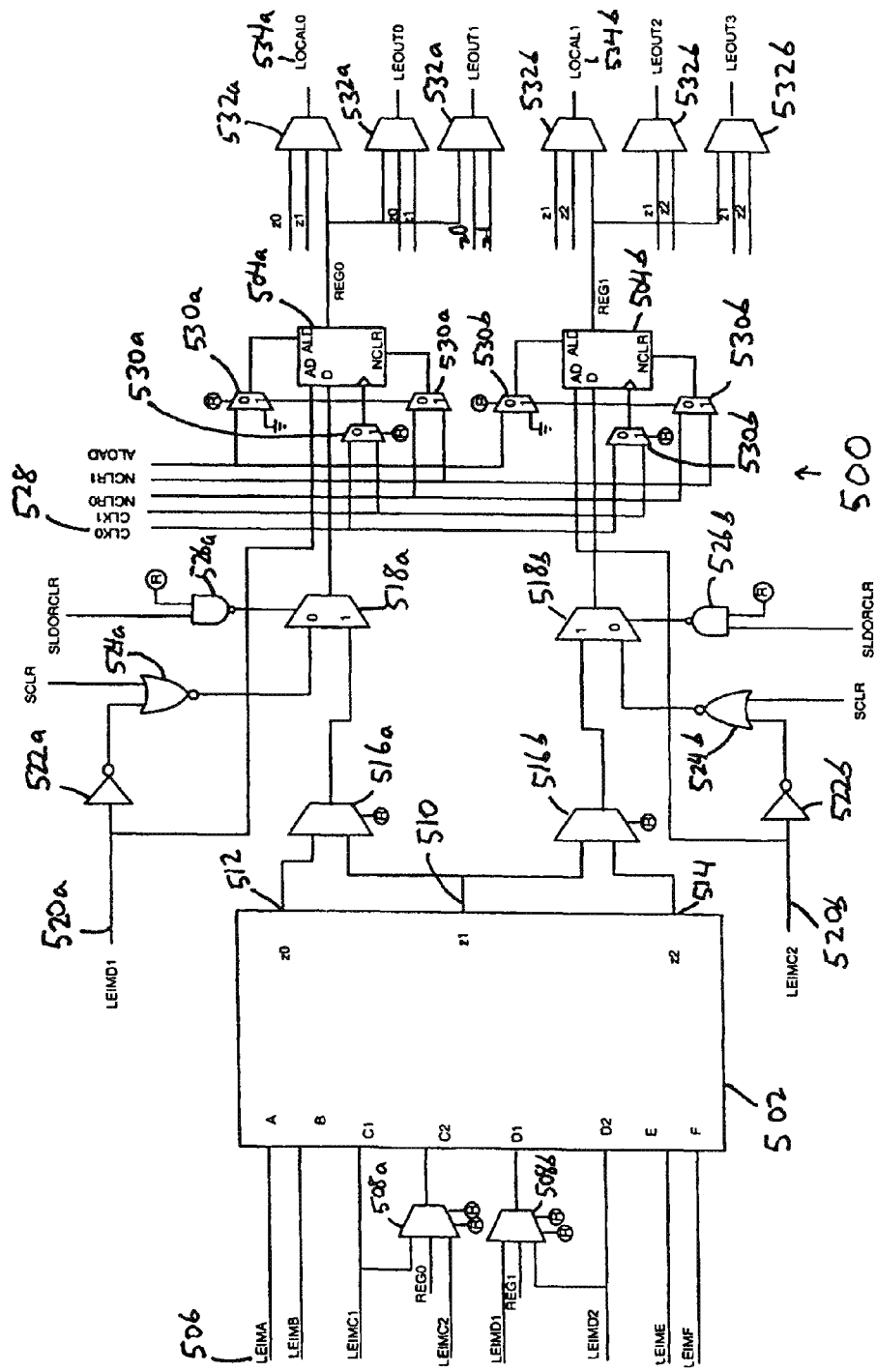
FIG. 5 shows a fracturable (6,2)-LUT with support for a 6-LUT and two independent registers according to an embodiment of the present invention.

FIG. 5 shows a logic element 500 according to another embodiment of present invention. This logic element 500 is similar to the logic element 300 of FIG. 3 but includes additional multiplexing at the inputs to the LUT 502. Input line LEIMC1 506 feeds the C1 input of the LUT 502, and input lines LEIMC1 and LEIMC2 506 together with register value REG0 are inputs to a multiplexer 508a that feeds the C2 input of the LUT 502. Input line LEIMD2 506 feeds the D2 input of the LUT 502, and input lines LEIMD1 and LEIMD2 506 together with register value REG1 are inputs to a multiplexer 508b that feeds the D1 input of the LUT 502.

The logic element 500 includes a fracturable (6,2)-LUT 502 and two flip-flops 504a, 504b. The (6,2)-LUT 502 has inputs A, B, C1, C2, D1, D2, E, and F, where these are fed through input lines LEIMA, LEIMB, LEIMC1, LEIMC2, LEIMD1, LEIMD2, LEIME, and LEIMF 506. Additionally two multiplexers 508a, 508b feed inputs C2 and D1 by multiplexing LEIMC1 and LEIMC2 with REG0 and by multiplexing LEIMD1 and LEIMD2 with REG1. As distinct from the embodiment of FIG. 3, the first multiplexer 508a, which feeds input C2, receives input from input line LEIMC1, input line LEIMC2 and register value REG0, and the second multiplexer 408b, which feeds input D1, receives input from input line LEIMD1, input line LEIMD2 and register value RFG1.

Similarly as in the embodiment of FIG. 3, the LUT 502 provides a single output z1 510 in a non-fractured mode and two outputs, z0 512 and z2 514, in a fractured mode. Also as in the previous embodiment the circuitry includes additional lines for LEMC1 520a and LEMC2 520b, multiplexers 516a, 516b, 518a, 518b, 530a, 530b, 532a, 532b, inverters 522a, 522b, NOR-gates 524a, 524b, NAND-gates 526a, 526b, stored values 528, and outputs 534a, 534b.

The embodiment of FIG. 5 enables increased flexibility by combining flip-flops 504a, 504b with LUTs so as to allow the 6-LUT 502 to be combined with two independent registers (REG0 at the first multiplexer 508a and REG1 at the second multiplexer 508b). By allowing either of C1/2 or D1/2 to be driven onto the corresponding pin, a single signal may be used for each of C and D. In the embodiment of FIG. 5, C1 can be used as a LUT input and C2 as a data input to a flip-flop 504b, while D2 is used as another input to the LUT, and D1 as a data input to a flip-flop 504a. The exact choice of which input is used for which flip-flop, and which input signal is used as LUT input or flip-flop data will depend on the properties of the logic circuit being built. Further, the choice of which inputs should be split may vary depending on the amount of flip-flop packing flexibility that is included. As more multiplexers are included to increase the flip-flop packing flexibility, the added delay may cause it to be preferable to split slower inputs rather than the fastest ones. The best choice will depend on the logic circuits to be implemented as well as the tradeoffs in delay in the design of the LUT.

In the embodiment of FIG. 5, quick feedback is only supported with a single flip-flop used in the logic element. As discussed above, alternative embodiments result from adding extra inputs to the multiplexers to support two quick feedbacks.

Figure 6:
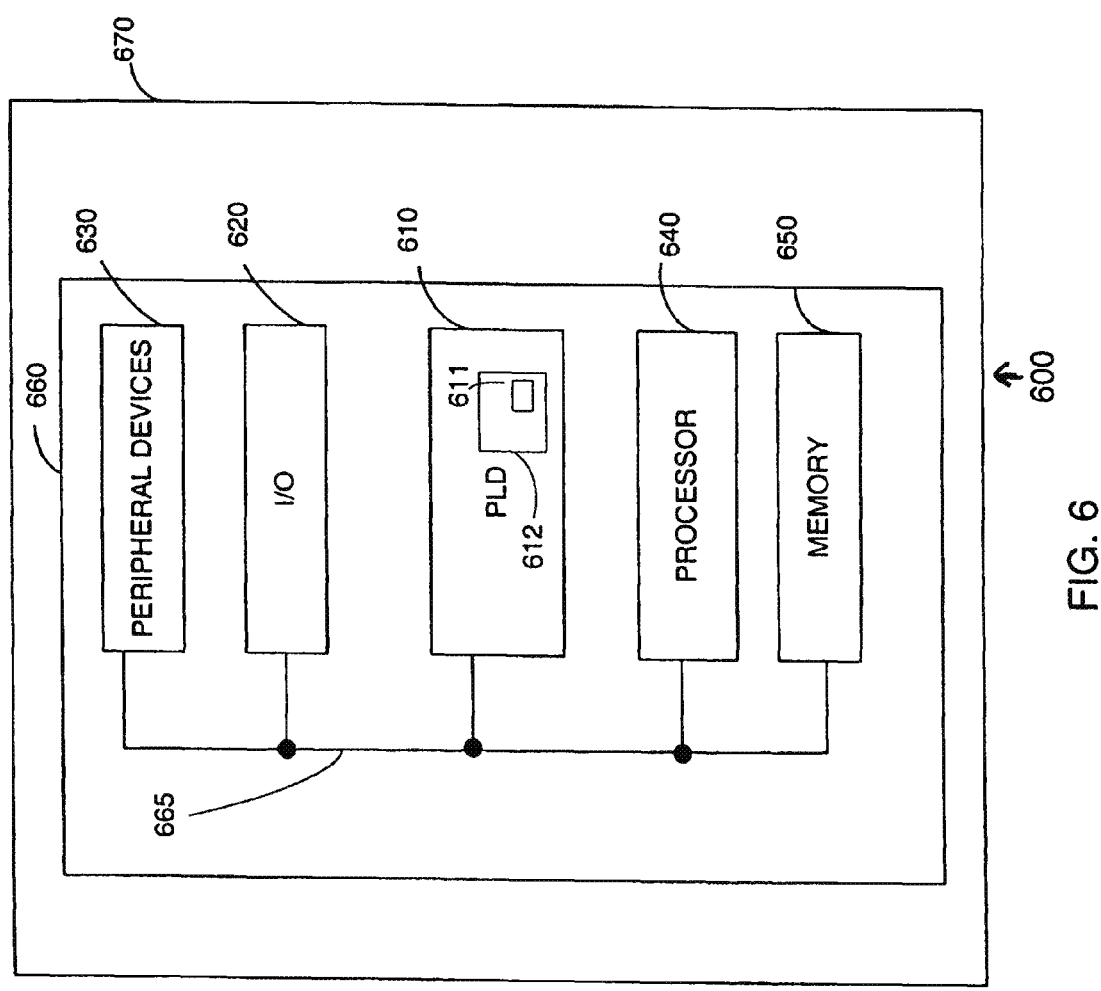
FIG. 6 shows an exemplary data processing system including an exemplary programmable logic device in which logic circuits in accordance with the present invention might be implemented.

FIG. 6 shows a data processing system 600 with a PLD 610 that may include embodiments of the present invention as discussed above. The PLD 610 includes a plurality of logic array blocks (LABS) such as the illustrated LAB 612. (Only one LAB is shown to avoid overcomplicating, the drawing.) The LAB 612 includes a plurality of logic elements such as the illustrated logic element 611. (Only one logic element is shown to avoid overcomplicating the drawing.) The data processing system 600 may include one or more of the following components: a processor 640; memory 650; I/O circuitry 620; and peripheral devices 630. These components are coupled together by a system bus 665 and are populated on a circuit board 660 which is contained in an end-user system 670.

The system 600 can be used in a wide variety of applications, such as computer networking, data networking, instrumentation, video processing, digital signal processing, or any other application where the advantage of using programmable or reprogrammable logic is desirable. The PLD 610 can be used to perform a variety of different logic functions. For example, the PLD 610 can be configured as a processor or controller that works in cooperation with processor 640 (or, in alternative embodiments, a PLD might itself act as the sole system processor). The PLD 610 may also be used as an arbiter for arbitrating access to shared resources in the system 600. In yet another example, the PLD 610 can be configured as an interface between the processor 640 and one of the other components in system 600. It should be noted that system 600 is only exemplary.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A logic element comprising:
   a plurality of multiplexers operable to receive a plurality of control signals; and
   a plurality of memory elements coupled to the plurality of multiplexers,
   wherein the plurality of multiplexers and the plurality of memory elements are operable to selectively operate in a non-fractured operational mode or in a fractured operational mode,
   wherein a single functional operation is performed by the plurality of multiplexers and the plurality of memory elements, in the non-fractured operational mode, wherein the plurality of multiplexers is controlled by the plurality of control signals, and wherein a plurality of functions is performed by a subset of the plurality of multiplexers controlled by a subset of the plurality of control signals in the fractured operational mode.

2. The logic element of claim 1, wherein the plurality of memory elements is operable to receive input signals, and wherein at least one of the input signals is split into a plurality of input signals.

3. The logic element of claim 1, wherein the plurality of multiplexers and the plurality of memory elements are operable to selectively perform a first plurality of functions or a second plurality of functions in the fractured operational mode.

4. The logic element of claim 1, wherein the plurality of multiplexers is arranged as a plurality of levels of multiplexers.

5. The logic element of claim 1, wherein the plurality of multiplexers and the plurality of memory elements form a six input look-up-table (LUT) in the non-fractured operational mode.

6. The logic element of claim 1, wherein the plurality of multiplexers and the plurality of memory elements form two four input LUTs in the fractured operational mode.

7. The logic element of claim 1, wherein outputs of the plurality of multiplexers are provided to inputs of at least one flip-flop.

8. A programmable logic device comprising:
   a plurality of logic elements, wherein at least one of the plurality of logic elements includes:
      a plurality of multiplexers operable to receive a plurality of control signals; and
      a plurality of look-up-tables (LUTs) coupled to the plurality of multiplexers,
      wherein the plurality of multiplexers and the plurality of LUTs are operable to selectively implement a first function or a second function,
      wherein a single functional operation is performed by the plurality of multiplexers and the plurality of memory elements in response to implementing the first function, wherein the plurality of multiplexers is controlled by the plurality of control signals, and wherein a plurality of functional operations is performed by a subset of the plurality of multiplexers controlled by a subset of the plurality of control signals in response to implementing the second function.

9. The programmable logic device of claim 8, wherein the plurality of LUTs is operable to receive input signals, and wherein at least one of the input signals is split into a plurality of input signals.

10. The programmable logic device of claim 8, wherein the plurality of multiplexers and the plurality of LUTs are operable to selectively implement a first plurality of functional operations or a second plurality of functional operations in response to implementing the second function.

11. The programmable logic device of claim 8, wherein the plurality of multiplexers is arranged as a plurality of levels of multiplexers.

12. The programmable logic device of claim 8, wherein the first function forms a six input LUT.

13. The programmable logic device of claim 8, wherein the second function forms two four input LUTs.

14. The programmable logic device of claim 8, wherein outputs of the plurality of multiplexers are provided to inputs of at least one flip-flop.

15. A system comprising:
   a first plurality of multiplexers operable to receive a plurality of control signals;

a plurality of memory elements coupled to the first plurality of multiplexers; and a second plurality of multiplexers operable to switch the first plurality of multiplexers and the plurality of memory elements to operate in a non-fractured operational mode or a fractured operational mode, wherein a single functional operation is performed by the first plurality of multiplexers and the plurality of memory elements, in the non-fractured operational mode, wherein the first plurality of multiplexers is controlled by the plurality of control signals, and wherein a plurality of functions is performed by a subset of the first plurality of multiplexers controlled by a subset of the plurality of control signals in the fractured operational mode.

16. The system of claim 15, wherein the plurality of memory elements is operable to receive input signals, and wherein at least one of the input signals is split into a plurality of input signals.

17. The system of claim 15, wherein the first plurality of multiplexers and the plurality of memory elements are operable to selectively perform a first plurality of functions or a second plurality of functions in the fractured operational mode.

18. The system of claim 15, wherein the first plurality of multiplexers is arranged as a plurality of levels of multiplexers.

19. The system of claim 15, wherein the first plurality of multiplexers and the plurality of memory elements form a six input LUT in the non-fractured operational mode.

20. The system of claim 15, wherein the first plurality of multiplexers and the plurality of memory elements form two four input LUTs in the fractured operational mode.

* * * * *